United States Patent
Sakamoto

(10) Patent No.: US 9,837,782 B2
(45) Date of Patent: Dec. 5, 2017

(54) LASER MODULE

(71) Applicant: FUJIKURA LTD., Tokyo (JP)

(72) Inventor: Shinichi Sakamoto, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 14/436,383

(22) PCT Filed: Oct. 4, 2013

(86) PCT No.: PCT/JP2013/077114
§ 371 (c)(1),
(2) Date: Apr. 16, 2015

(87) PCT Pub. No.: WO2014/061474
PCT Pub. Date: Apr. 24, 2014

(65) Prior Publication Data
US 2015/0303643 A1    Oct. 22, 2015

(30) Foreign Application Priority Data

Oct. 17, 2012   (JP) ................. 2012-229553

(51) Int. Cl.
*H01S 3/30* (2006.01)
*H01S 3/067* (2006.01)
(Continued)

(52) U.S. Cl.
CPC ........ *H01S 3/06708* (2013.01); *G02B 6/0006* (2013.01); *G02B 6/0013* (2013.01);
(Continued)

(58) Field of Classification Search
CPC .... H01S 3/06708; H01S 5/405; H01S 5/4012; H01S 5/42; G02B 6/0066; G02B 6/0013;
(Continued)

(56) References Cited

U.S. PATENT DOCUMENTS 5,600,744 A * 2/1997 Takahashi ............ G02B 6/4203
                                                        385/35
5,633,967 A * 5/1997 Haruta .................. B23K 26/06
                                                        385/33
(Continued)

FOREIGN PATENT DOCUMENTS

CN          201548723 U      8/2010
DE    WO 2010060963 A2 *     6/2010    .......... G02B 6/0288
(Continued)

OTHER PUBLICATIONS

International Search Report dated Nov. 12, 2013, issued in corresponding application No. PCT/JP2013/077114.
(Continued)

*Primary Examiner* — Yuanda Zhang
(74) *Attorney, Agent, or Firm* — Westerman, Hattori, Daniels & Adrian, LLP

(57) ABSTRACT

A light incidence plane of the core 15 includes a plurality of planes 15a to 15c unparalleled with each other to which a light beam emitted from at least one laser element 21 is entered. When seen on a cross section taken along the longer direction of an optical fiber 10, light beams entered to a core 15 from the inclined planes 15b and 15c inclined to an axis CA of the optical fiber 10 in the plurality of the planes 15a to 15c are propagated from a region surrounded by a line and the inclined planes 15b and 15c forming an acute angle, the line being passed through the incident points of the light beams entered to the inclined planes 15b and 15c and parallel with an axis CA.

9 Claims, 5 Drawing Sheets

(51) Int. Cl.
*F21V 8/00* (2006.01)
*G02B 6/26* (2006.01)
*H01S 5/40* (2006.01)
*G02B 6/42* (2006.01)
*G02B 6/02* (2006.01)
*G02B 27/09* (2006.01)
*G02B 27/10* (2006.01)
*H01S 5/42* (2006.01)

(52) U.S. Cl.
CPC ............. *G02B 6/0066* (2013.01); *G02B 6/02* (2013.01); *G02B 6/262* (2013.01); *G02B 6/42* (2013.01); *G02B 6/4206* (2013.01); *G02B 27/09* (2013.01); *G02B 27/10* (2013.01); *H01S 5/405* (2013.01); *H01S 5/4012* (2013.01); *H01S 5/42* (2013.01)

(58) Field of Classification Search
CPC ...... G02B 6/0006; G02B 6/4206; G02B 6/02; G02B 27/10; G02B 6/42; G02B 27/09; G02B 6/262
See application file for complete search history.

(56) References Cited

U.S. PATENT DOCUMENTS

| | | | | |
|---|---|---|---|---|
| 5,734,765 A | * | 3/1998 | Artjushenko | G02B 6/241 385/123 |
| 6,137,938 A | * | 10/2000 | Korn | G02B 6/241 385/123 |
| 6,724,959 B1 | * | 4/2004 | Takahashi | G02B 6/262 385/33 |
| 7,295,729 B2 | * | 11/2007 | Cheng | B29D 11/00663 385/33 |
| 9,090,666 B2 | * | 7/2015 | Wang | C07K 1/26 |
| 2001/0012425 A1 | | 8/2001 | Irie et al. | |
| 2002/0159693 A1 | * | 10/2002 | Wolak | G02B 6/262 385/33 |
| 2003/0048987 A1 | * | 3/2003 | Saito | G02B 6/2552 385/33 |
| 2012/0301078 A1 | * | 11/2012 | Cheng | G02B 6/262 385/33 |

FOREIGN PATENT DOCUMENTS

| | | |
|---|---|---|
| JP | 54-19762 | 2/1979 |
| JP | 10-307230 A | 11/1998 |
| JP | 2011-243717 A | 12/2011 |
| WO | 2011/091170 A2 | 7/2011 |

OTHER PUBLICATIONS

Chinese Office Action dated Oct. 26, 2015, issued in counterpart Chinese Patent Application No. 201380054089.3 with English translation.

* cited by examiner

LASER MODULE

TECHNICAL FIELD

The present invention relates to a laser module that can efficiently emit light.

BACKGROUND ART

Since a fiber laser device has excellent light condensing properties, can obtain a small beam spot of high power density, and can perform processing in a non-contact manner, the fiber laser device is used in various fields such as laser processing fields and medical fields. More specifically, fiber laser devices used in processing fields and medical fields provide high power output.

In association with the provision of high power output to the fiber laser device, a pumping light source for use in the fiber laser device is also demanded to emit high power light. Generally, the pumping light source is configured in which a light beam emitted from a semiconductor laser element is entered to an optical fiber and light is emitted from the optical fiber. In order to emit light of high power from the pumping light source, light beams emitted from a plurality of semiconductor laser elements is condensed and entered to the optical fiber.

Patent Document 1 below describes a laser module that can be used for a pumping light source like this. In the laser module described in Patent Document 1, laser light beams emitted individually from a plurality of semiconductor laser elements are collimated to each other, condensed at the end face of an optical fiber through a single condenser lens, and then entered to the optical fiber.

CITATION LIST

Patent Document

[Patent Document 1] JP-A-2011-243717

SUMMARY OF INVENTION

Objects to be Achieved by the Invention

It is considered that in the laser module described in Patent Document 1, the number of semiconductor laser elements is increased, a light beam is entered to the optical fiber as described above, and light of greater intensity is emitted from the optical fiber. However, in this case, since a large number of semiconductor laser elements are arranged, the angle of incidence of a light beam emitted from a semiconductor laser element arranged at the end is increased too much, and sometimes exceeds the numerical aperture (NA) of the core of the optical fiber. Therefore, this laser module has a problem in that in light beams emitted from a large number of semiconductor laser elements, a part of light is leaked and is not enabled to propagate through the optical fiber.

Therefore, it is an object of the present invention to provide a laser module that can efficiently emit light beams emitted from a plurality of semiconductor laser elements.

Means for Achieving the Objects

In order to solve the problem, the present inventor dedicatedly investigated that a light beam entered to an optical fiber is not to exceed the numerical aperture (NA) of the core. As a result, attention was focused on the fact that in a typical optical fiber, the light incidence plane of the core is perpendicular to the axis of the optical fiber and the angle of incidence of light to the axis of the optical fiber is restricted, and the present inventor invented the present invention.

That is, a laser module according to the present invention includes: a plurality of laser elements; and an optical fiber including a core to which light beams emitted from the plurality of the laser elements are entered, wherein a light incidence plane of the core includes a plurality of planes unparalleled with each other to which a light beam emitted from at least one laser element is entered, and when seen on a cross section along a longer direction of the optical fiber, a light beam entered to the core from an inclined plane inclined to an axis of the optical fiber in the plurality of the planes is propagated from a region surrounded by a line and the inclined plane forming an acute angle, the line being passed through an incident point of the light beam entered to the inclined plane and parallel with the axis.

Since the incidence plane includes a plurality of planes unparalleled with each other, at least one plane of the incidence planes is an inclined plane inclined to the axis of the optical fiber. A light beam entered to this inclined plane is entered from the region, and the light beam is propagated in the state in which the traveling direction after entered comes closer to the axis of the optical fiber than a light beam that is reached on a plane perpendicular to the axis from the same direction and entered to the core. Therefore, even a light beam exceeding the numerical aperture (NA) of the core when entered to the core from the plane perpendicular to the axis of the optical fiber is entered from the inclined plane to the core as described above, so that the exceeding of the numerical aperture (NA) of the core can be suppressed. Accordingly, it is possible to suppress the leakage of light beams emitted from a plurality of semiconductor laser elements from an optical fiber, and to efficiently emit light.

Note that, in the case where the incidence plane of the core includes a plurality of inclined planes, the leakage of light beams entered from the inclined planes to the core to a cladding is suppressed. As described above, a plurality of light beams that leakage to the cladding is suppressed is condensed, so that it is possible to propagate light of greater intensity as light beams entered to the core as a whole, as compared with the case where light beams are entered only to the incidence plane perpendicular to the axis of the optical fiber.

Moreover, in the case where the incidence plane of the core includes only one inclined plane, in a plurality of the planes, another plane is a vertical surface perpendicular to the optical fiber. Light beams can be entered from this vertical surface to the core similarly to light beams entered to an optical fiber in a previously existing laser module. On the other hand, the leakage of a light beam entered from the inclined plane to the cladding is suppressed as described above. Therefore, it is possible to propagate light of greater intensity as light beams entered to the core as a whole, as compared with the case where light beams are entered only to the incidence plane perpendicular to the axis of the optical fiber.

Furthermore, when seen on a cross section along the longer direction of the optical fiber, it is preferable that an expression is satisfied:

$$\theta_{light} + \theta_{angle} < \theta_{taper}$$

where a size of an acute angle formed between the inclined plane and the axis is defined as $\theta_{taper}$, a size of an angle that is a corresponding angle of the acute angle and formed between the optical axis and the axis is defined as $\theta_{light}$, and an angle of divergence of a light beam entered from the inclined plane to the core with respect to the optical axis is defined as $\theta_{angle}$.

The size that the size of the angle $\theta_{light}$ formed between the optical axis of a light beam and the axis of the fiber is added to the divergence angle $\theta_{angle}$ to the optical axis of the light beam is made smaller than the size of the angle $\theta_{taper}$ formed between the inclined plane and the axis of the optical fiber, and in light beams entered from the inclined plane to the core, at least a light portion on the optical axis and a light portion on the inclined plane side of the optical axis are reached on the inclined plane and are entered to the core without being cut off by the other plane. Therefore, it is possible to more efficiently enter light beams to the optical fiber.

Moreover, when seen on a cross section along the longer direction of the optical fiber, it is preferable that an expression is satisfied:

$$\theta_{NA} < \theta_{taper}$$

where a maximum angle of incidence of a light beam that does not leak from the core when a light beam is entered to the core from a plane perpendicular to the axis is defined as $\theta_{NA}$.

The size of the angle $\theta_{taper}$ formed between the inclined plane and the axis of the optical fiber is made greater than $\theta_{NA}$ that is the maximum angle of incidence of a light beam that does not leak from the core when the light beam is entered to the core from the plane perpendicular to the axis of the optical fiber, so that a light beam that exceeds the numerical aperture (NA) of the core in the case where the light beam is entered to the core from the incidence plane perpendicular to the axis of the optical fiber can be surely propagated to the inclined plane.

Moreover, it is preferable that all of expressions are satisfied:

$$\frac{n_{core}}{n_{clad}} \times \sin\left(\sin^{-1}\left(\frac{\sin(\frac{\pi}{2} - \theta_{taper} + \theta_{light} + \theta_{angle})}{n_{core}}\right) + \theta_{taper}\right) \geq 1$$

$$\frac{n_{core}}{n_{clad}} \times \sin\left(\sin^{-1}\left(\frac{\sin(\frac{\pi}{2} - \theta_{taper} + \theta_{light} - \theta_{angle})}{n_{core}}\right) + \theta_{taper}\right) \geq 1$$

where a refractive index of the core of the optical fiber is defined as $n_{core}$, and a refractive index of a cladding of the optical fiber is defined as $n_{clad}$.

These conditions are satisfied, so that it is possible to further suppress the leakage of a light beam after entered to the cladding as long as such conditions are provided that the optical fiber is bent, for example.

Moreover, it is preferable that optical axes of light beams entered from the individual planes to the core are caused to be collimated to the axis.

The optical axes after entered to the core are collimated to the axis of the optical fiber, so that the leakage of the light beams after entered to the cladding can be further suppressed. Therefore, it is possible to further suppress the leakage of light beams to the cladding even in the region in which the optical fiber is bent, for example.

Moreover, in light beams entered from the individual planes to the core, it is preferable that light beams emitted from at least the two laser elements are condensed on the individual planes through a condenser lens.

Light beams emitted from a plurality of the laser elements are condensed on the individual planes, so that light beams of greater intensity can be entered from the individual planes. Therefore, it is possible to emit light of greater intensity.

Moreover, in this case, it is preferable that light beams before condensed through the condenser lens are collimated light beams, and the collimated light beams are collimated to each other.

Light beams condensed through the condenser lens are a plurality of light beams collimated to each other, so that the focal point can be made much smaller. Therefore, even in the case where planes forming the incidence plane are small, light beams emitted from a larger number of laser elements can be entered to the core. Therefore, it is possible to enter light of greater intensity to the optical fiber.

Moreover, in the plurality of the planes, it is preferable that one plane is a vertical surface perpendicular to the axis.

The incidence plane includes a vertical surface perpendicular to the axis, so that light beams can be entered to the core also from the axial direction of the optical fiber. Note that, it is also possible that light beams are entered to the plane perpendicular to the axis from the axial direction of the optical fiber as described above, as well as light beams can be entered to the plane perpendicular to the axis from the direction inclined to the axis within the range not exceeding the numerical aperture (NA) of the core similarly to a previously existing laser module. Therefore, in addition to the fact that a light beam emitted from the laser element can be entered to the optical fiber similarly to a previously existing laser module, light beams can be entered to the inclined plane as described above, so that a larger number of light beams can be entered to the optical fiber.

Moreover, in the plurality of the planes, it is preferable that at least two planes are the inclined planes, and one inclined plane is matched with a face that the other inclined plane is rotated relative to the axis.

As described above, the relationship is provided in which a pair of the planes is rotated to each other about the axis, so that an optical system including a laser element that emits a light beam entered from one inclined plane to the core and an optical system including a laser element that emits a light beam entered from the other inclined plane to the core can be disposed as the optical systems are rotated about the axis of the optical fiber. Therefore, it is possible that spaces in which the optical systems are disposed are efficiently used and that a larger number of laser elements are disposed.

Moreover, it is preferable that the plane is a plane in a shape including a longer direction and a shorter direction, and a light beam emitted from the laser element is entered from the plane to the core as a slow axial direction is aligned with the longer direction of the plane.

The shape on a cross section perpendicular to the optical axis of a light beam emitted from the laser element is long in the slow axial direction and short in the fast axial direction. Therefore, the longer direction of the plane is aligned with the slow axial direction of a light beam, so that light beams can be more efficiently entered. More specifically, in the case where light beams emitted from at least two laser elements are condensed on the planes through the condenser lens, the slow axial directions of light beams to be condensed are aligned with the longer direction of the plane, so that it is possible that light beams are more efficiently condensed and entered.

Effect of Invention

As described above, according to the present invention, there is provided a laser module that can efficiently emit light beams emitted from a plurality of semiconductor laser elements.

DESCRIPTION OF EMBODIMENTS

In the following, preferred embodiments of a laser module according to the present invention will be described in detail with reference to the drawings.

First Embodiment

Figure 1:
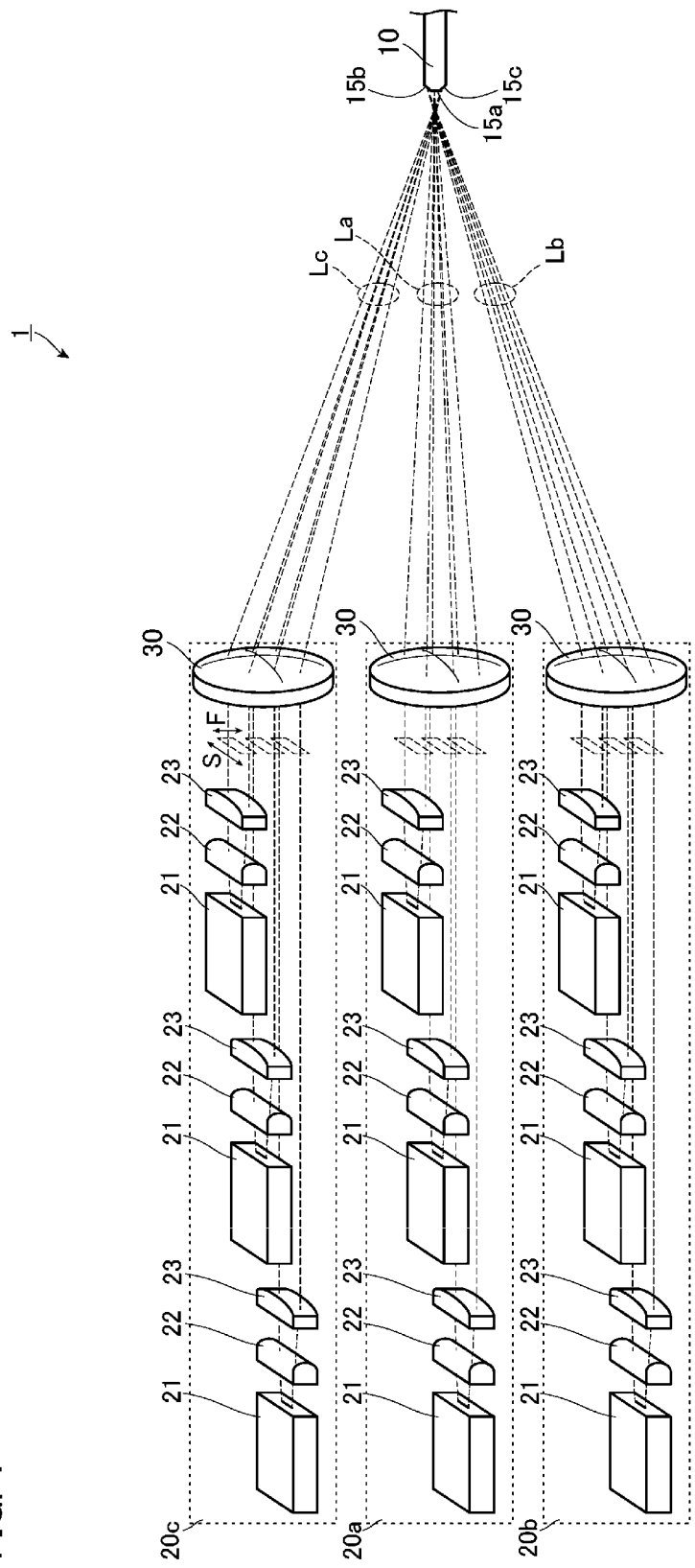
FIG. 1 is a conceptual diagram of a laser module according to a first embodiment of the present invention.

FIG. 1 is a conceptual diagram of a laser module according to a first embodiment of the present invention. As illustrated in FIG. 1, a laser module 1 according to the embodiment includes a plurality of optical units 20a, 20b, and 20c and an optical fiber 10 to which light beams are individually emitted from the optical units 20a, 20b, and 20c as a main configuration. Note that, since FIG. 1 is a conceptual diagram of the laser module 1 as described above, the dispositions, shapes, and the like of members are sometimes different from those of the actual laser module, and a housing and the like are omitted.

In the embodiment, the optical units 20a to 20c are disposed in parallel with one another. More specifically, the optical units 20a to 20c are disposed in such a manner that the optical unit 20a is sandwiched between the optical unit 20b and the optical unit 20c.

The optical unit 20a includes a plurality of laser elements 21 from which light beams are emitted, a plurality of cylindrical lenses 22 provided corresponding to the laser elements 21, a plurality of cylindrical lenses 23 provided corresponding to the laser elements 21 in a shape different from the shape of the cylindrical lens 22, and a condenser lens 30 as a main configuration.

Each of the laser elements 21 is formed of a similarly configured semiconductor laser element in which a plurality of semiconductor layers is stacked and these semiconductor layers form a resonance structure. Then, each of the laser elements 21 outputs a laser light beam at a waveband of 900 nm, for example, from the light emitting face. Note that, the laser element 21 according to the embodiment is configured in which light is oscillated in multimode in the slow axial direction in such a manner that the intensity of light to be outputted is increased.

Moreover, the laser elements 21 are disposed in such a manner that light beams to be emitted are overlaid in the fast axial direction but not overlaid in the slow axial direction, and light beams to be emitted from the laser elements 21 are emitted in the directions in which the optical axes of the light beams are collimated to one another. Note that, in FIG. 1, the case is illustrated where the number of the laser elements 21 of the optical unit 20a is three.

Each of the cylindrical lenses 22 is in a nearly cylindrical shape, and one side surface formed along the longer direction is a flat surface. Moreover, the other side surface located on the opposite side of the one side surface is flat in the longer direction and is convexly curved on a cross section perpendicular to the longer direction. The other side surface is a lens surface. Then, the cylindrical lenses 22 are disposed in the state in which the flat one side surface is faced to the light emitting face of each of the laser elements 21, the other side surface, which is the lens surface, is faced opposite to the laser element 21 side, and the longer direction is aligned with the slow axial direction of the laser element 21. Note that, the degree of the curve of the lens surface of each of the cylindrical lenses 22 is a degree that the fast axial directions of light beams emitted from the laser elements 21 are collimated through the cylindrical lenses 22.

Each of the cylindrical lenses 23 is in a nearly cylindrical shape, and one side surface formed along the longer direction is a flat surface. Moreover, the other side surface located on the opposite side of the one side surface is convexly curved in the longer direction and flat on a cross section perpendicular to the longer direction. The other side surface is a lens surface. Then, each of the cylindrical lenses 23 is disposed in the state in which a flat one side surface is faced to the lens surface of each of the cylindrical lenses 22, the lens surface, which is the other side surface, is faced opposite to the cylindrical lens 22 side, and the longer direction is aligned with the longer direction of the cylindrical lens 22. Note that, the degree of the curve of the lens surface of each of the cylindrical lenses 23 is a degree that the slow axial directions of light beams emitted from the cylindrical lens 22 are collimated through each of the cylindrical lenses 23.

The condenser lens 30 is a convex lens configured in which a light beam is entered from each of the cylindrical lenses 23 and light beams La emitted are condensed on the nearly center of the one end portion of the optical fiber 10.

The optical unit 20b and the optical unit 20c have a configuration similar to that of the optical unit 20a. However, the optical unit 20b is different from the optical unit 20a in that light beams Lb emitted from the condenser lens 30 are condensed on the condenser lens 30 side of the optical unit 20c rather than the center at the one end portion of the optical fiber 10. Moreover, the optical unit 20c is different from the optical unit 20a in that light beams Lc emitted from the condenser lens 30 are condensed on the condenser lens 30 side of the optical unit 20b rather than the center at the one end portion of the optical fiber 10. The condenser lenses 30 of the optical unit 20b and the optical unit 20c are disposed in the state in which the positions are slightly displaced so as to condense the light beams as described above.

Figure 2:
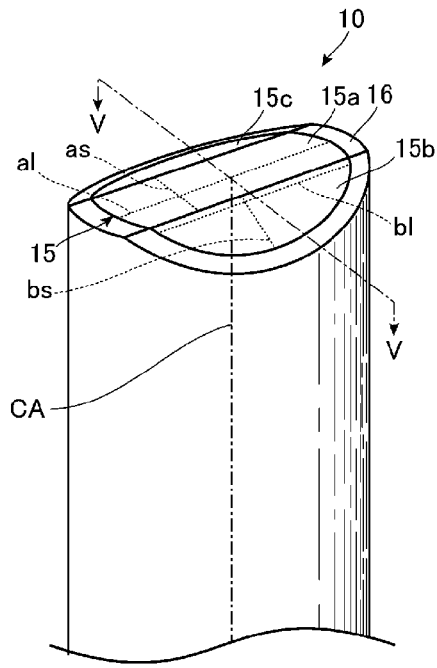
FIG. 2 is a diagram of the appearance of one end portion of an optical fiber in FIG. 1.

FIG. 2 is a diagram of the appearance of one end portion of the optical fiber 10 in FIG. 1. The optical fiber 10 includes a core 15 and a cladding 16 that encloses the outer circumferential surface of the core 15 with no gap as illustrated in FIG. 2, and is a multimode fiber, for example. The core 15 has a refractive index higher than that of the cladding 16, and has a diameter of 105 µm, for example. The cladding 16 encloses the outer circumferential surface of the core 15 with no gap, and the outer shape is 125 µm, for example.

Moreover, the optical fiber 10 is configured in which a light incidence plane is formed at one end portion of the core 15 and the incidence plane is formed of a plurality of planes unparalleled with each other. In the embodiment, an example is shown in which the incidence plane of the core 15 is formed of three planes 15a, 15b, and 15c.

The plane 15a in the center is a face in a long, narrow shape having a longer direction al depicted in a dotted line and a shorter direction as depicted in a dotted line, and is a vertical surface perpendicular to an axis CA of the optical fiber 10. The center of the plane 15a is matched with the intersection point of the axis CA with the plane 15a. Moreover, the plane 15b is in a long, narrow shape having a longer direction bl depicted in a dotted line and a shorter direction bs depicted in a dotted line, and is an inclined plane inclined to the axis CA. Similarly, the plane 15c is in a long, narrow shape having a longer direction and a shorter direction, and is an inclined plane inclined to the axis CA. Then, in the planes 15b and 15c, which are two inclined planes, the plane 15b is matched with a face that the other plane 15c is rotated relative to the axis CA. In other words, the planes 15b and 15c are inclined on the opposite sides to each other at the same angle to the axis CA. Moreover, the planes 15b and 15c are formed at positions adjacent to the plane 15a and sandwiching the plane 15a, and are apart from the axis CA on the opposite sides at the same distance. Although the angle at which the planes 15b and 15c are inclined to the axis CA is not limited more specifically, the angle is an angle of 85°, for example. In this case, the planes 15b and 15c are inclined at an angle of 5° to the plane 15a.

As described above, the optical fiber 10 having the light incidence plane formed of the planes 15a to 15c is disposed in such a manner that as illustrated in FIG. 1, the plane 15a is faced to the condenser lens 30 of the optical unit 20a, the plane 15c is located on the condenser lens 30 side of the optical unit 20b, and the plane 15b is located on the condenser lens 30 side of the optical unit 20c. Moreover, the optical fiber 10 is disposed in such a manner that the light beams from the optical unit 20b are condensed on the plane 15b, and the light beams from the optical unit 20c are condensed on the plane 15c.

Next, the optical operation of the laser module 1 will be described.

As depicted in broken lines in FIG. 1, light beams are emitted from the laser elements 21 of the optical units 20a to 20c. At this time, in the optical units 20a to 20c, the optical axes of the light beams emitted from the laser elements 21 are collimated to one another. Moreover, the wavelength of each of the light beams is a band of 900 nm, for example, as described above. The light beams emitted from the laser elements 21 are propagated while spreading in the fast axial direction and the slow axial direction, and entered to the cylindrical lenses 22. Then, light beams collimated in the fast axial direction are emitted from the cylindrical lenses 22. Subsequently, the light beams emitted from the cylindrical lenses 22 are propagated while spreading in the slow axial direction not in the fast axial direction, and entered to the cylindrical lenses 23. Then, light beams collimated in the slow axial direction are emitted from the cylindrical lenses 23. In this manner, light beams collimated in both of the fast axial direction and the slow axial direction are emitted from each of the cylindrical lenses 23, and the light beams emitted from the cylindrical lenses 23 are light beams collimated to each other in the optical units 20a to the optical unit 20c. Note that, the light beams collimated in both of the fast axial direction and the slow axial direction are illustrated in FIG. 1, in which the fast axial direction is denoted by F and the slow axial direction is denoted by S. Subsequently, the light beams emitted from the cylindrical lens 23 are entered to the condenser lens 30. Then, the light beams La, Lb, and Lc are emitted from the condenser lenses 30, and the light beams La, Lb, and Lc are propagated toward the incidence plane of the core 15 of the optical fiber 10 while being condensed.

Figure 3:
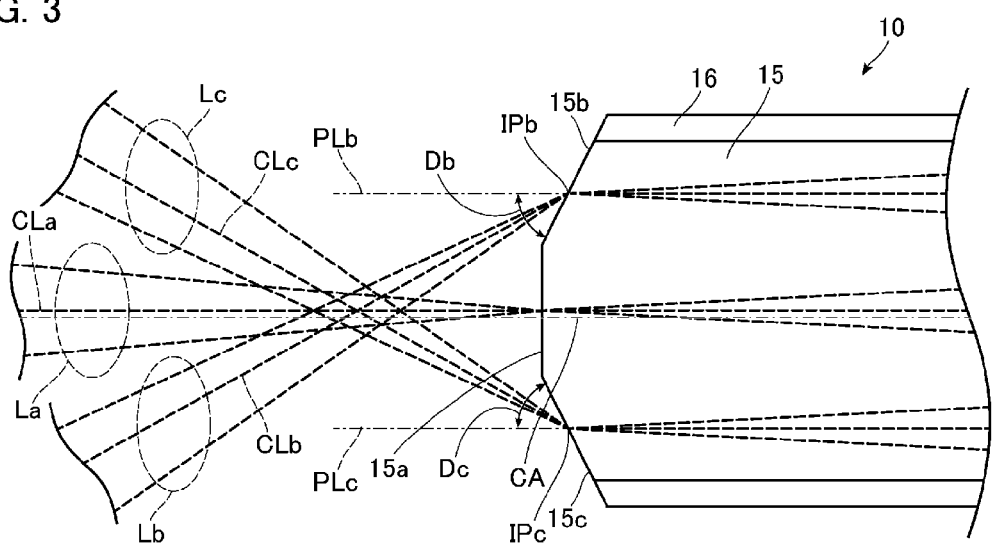
FIG. 3 is a diagram of a manner that light beams are entered to the optical fiber.

FIG. 3 is a diagram of a manner that light beams are entered to the optical fiber 10. In FIG. 3, the optical fiber 10 is depicted on a cross section taken along line V-V passed thorough the axis CA of the optical fiber 10 and perpendicular to the longer directions of the planes 15a to 15c in FIG. 2. Note that, for easy understanding, the axis CA is depicted in such a manner that the axis CA is slightly displaced in the radial direction.

Since the light beam La emitted from the condenser lens 30 of the optical unit 20a is condensed on the nearly center of the one end portion of the optical fiber 10 as described above, the light beam La is condensed on the nearly center of the plane 15a. At this time, the light beam La is condensed in the state in which the slow axial direction S is aligned with the longer direction al of the plane 15a and the fast axial direction F is aligned with the shorter direction as of the plane 15a. Moreover, as described above, since the optical fiber 10 is disposed in such a manner that the plane 15a is faced to the condenser lens 30 of the optical unit 20a, the light beam La is entered from the planes 15a to the core 15 as an optical axis CLa is along the axis CA. The light beam La entered to the core 15 is refracted based on the refractive index of the core 15, and propagated through the inside of the core 15.

Furthermore, the light beam Lb emitted from the condenser lens 30 of the optical unit 20b is condensed on the plane 15b, and entered from the plane 15b to the core 15. At this time, the light beam Lb is condensed and entered to the core 15 in the state in which the slow axial direction S is aligned with the longer direction bl of the plane 15b and the fast axial direction F is aligned with the shorter direction bs of the plane 15b. In addition, as described above, the optical fiber 10 is disposed in such a manner that the plane 15b is faced to the condenser lens 30 side of the optical unit 20c, the entire light beam Lb is reached on the plane 15b from the direction inclined to the same side as the inclination side of the plane 15b to the axis CA of the optical fiber 10, and the entire light beam Lb is entered to the core 15. In other words, when seen on a cross section taken along the longer direction of the optical fiber 10, the light beam Lb is propagated from a region Db surrounded by a line PLb and the plane 15b forming an acute angle, the line PLb being passed through an incident point IPb of the light beam entered to the plane 15b, which is an inclined plane, and parallel with the axis CA. Therefore, an optical axis CLb of the light beam Lb is also inclined to the same side as the inclination side of the plane 15b to the axis CA. The light beam Lb entered to the core 15 is refracted based on the refractive index of the core 15, and propagated through the inside of the core 15.

Moreover, the light beam Lc emitted from the condenser lens 30 of the optical unit 20c is condensed on the plane 15c, and entered from the plane 15c to the core 15. At this time, the light beam Lc is condensed and entered to the core 15 in the state in which the slow axial direction S is aligned with the longer direction of the plane 15c and the fast axial direction F is aligned with the shorter direction of the plane 15c. Furthermore, as described above, the optical fiber 10 is disposed in such a manner that the plane 15c is faced to the condenser lens 30 side of the optical unit 20b, the entire light beam Lc is reached on the plane 15c from the direction inclined to the same side as the inclination side of the plane 15c to the axis CA of the optical fiber 10, and the entire light beam Lc is entered to the core 15. In other words, when seen on a cross section taken along the longer direction of the optical fiber 10, the light beam Lc is propagated from a region Dc surrounded by a line PLc and the plane 15c forming an acute angle, the line PLc being passed through an incident point IPc of the light beam entered to the plane 15c, which is an inclined plane, and parallel with the axis CA. Therefore, an optical axis CLc of the light beam Lc is also inclined to the same side as the inclination side of the plane 15c to the axis CA. The light beam Lc entered to the core 15 is refracted based on the refractive index of the core 15, and propagated through the inside of the core 15.

Next, a manner that a light beam is entered to the core 15 of the optical fiber 10 will be described more in detail.

Figure 4:
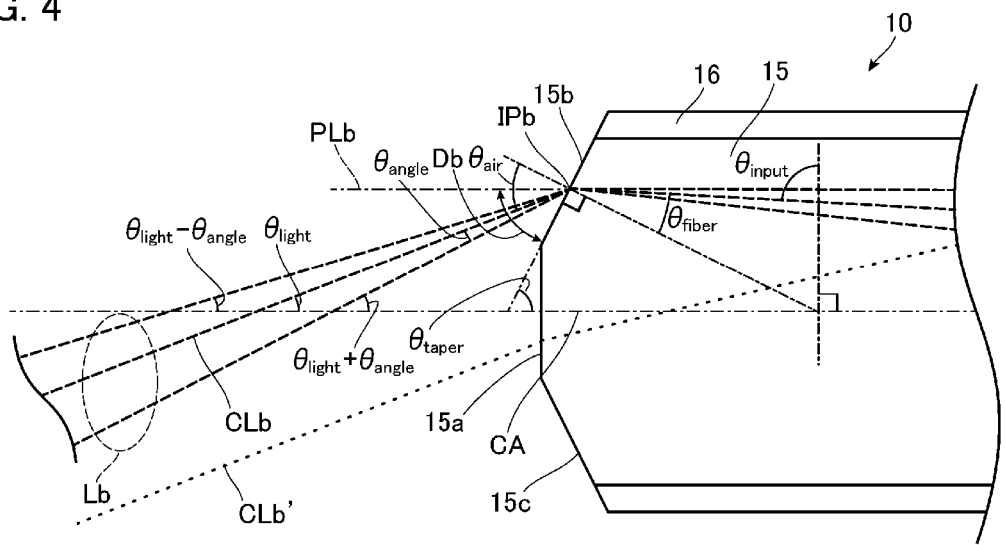
FIG. 4 is a diagram of a manner that a light beam emitted from a specific condenser lens is entered from a certain condenser lens to a core.

FIG. 4 is a diagram of a manner that a light beam emitted from a certain condenser lens 30 is entered to the core 15. More specifically, it is a diagram of a manner that the light beam Lb emitted from the condenser lens 30 of the optical unit 20b is entered from the plane 15b to the core 15. However, in FIG. 4, for easy understanding, the direction to which light is entered is slightly changed from the direction in FIG. 3.

As illustrated in FIG. 4, the size of an acute angle formed between the plane 15b and the axis CA of the optical fiber 10 is defined as $\theta_{taper}$, the size of an angle that is in the relationship of a corresponding angle with this acute angle and formed between the optical axis CLb of the light beam Lb and the axis CA is defined as $\theta_{light}$, and the size of an angle of divergence to the optical axis CLb of the light beam Lb is defined as $\theta_{angle}$. Moreover, the maximum angle of incidence of a light beam that does not leak from the core 15 when the light beam is entered from a plane perpendicular to the axis CA to the core 15 is defined as $\theta_{NA}$. The maximum incidence angle $\theta_{NA}$ of the light beam is an angle to the axis CA. This $\theta_{NA}$ is not illustrated in FIG. 4. Note that, in the case of an acute angle formed between the plane 15b and the axis CA, the plane 15b and the axis CA do not necessarily directly intersect with each other as illustrated in FIG. 4, and it may be fine that a plane extended from the plane 15b intersects with the axis CA to form an acute angle.

At this time, $\theta_{NA}$ is expressed by Expression (1) below using a refractive index $n_{core}$ of the core 15 and a refractive index $n_{clad}$ of the cladding 16.

$$\theta_{NA}=\sin^{-1}(\sqrt{n_{core}^2-n_{clad}^2}) \quad (1)$$

Then, in the embodiment, $\theta_{taper}$ satisfies Expression (2) below.

$$\theta_{NA}<\theta_{taper} \quad (2)$$

Expression (2) is satisfied, so that the light beam Lb can be propagated through the plane 15b from the direction inclined at an angle greater than $\theta_{NA}$ on the same side as the inclination side of the plane 15b to the axis CA. In other words, a light beam that exceeds the numerical aperture (NA) of the core when entered to the core 15 from the plane perpendicular to the axis CA can be propagated in the direction inclined to the same side as the inclination of the plane 15b, that is, the light beam can be propagated from the region Db to the plane 15b.

Moreover, in the angle formed between the axis CA and a portion of the light beam Lb closest to the plane 15b, the size of an angle in the relationship of a corresponding angle to an acute angle formed between the plane 15b and the axis CA of the optical fiber 10 can be expressed by $\theta_{light}+\theta_{angle}$ as illustrated in FIG. 4. Then, in the embodiment, as described above, the entire light beam Lb is reached on the plane 15b from the same side as the inclination side of the plane 15b to the axis CA. Therefore, $\theta_{light}+\theta_{angle}$ satisfies Expression (3) below.

$$\theta_{light}+\theta_{angle}<\theta_{taper} \quad (3)$$

As described above, Expression (3) above is satisfied in the case where the optical axis CLb is inclined to the same side as the inclination side of the plane 15b to the axis CA, so that in the light beam Lb, the light portion on the optical axis CLb and the light portion on the plane 15b side of the optical axis CLb can be reached on the plane 15b and entered to the core 15 from the direction inclined to the same side as the inclination side of the plane 15b to the axis CA without being cut off by the other incidence planes. In other words, in the light beam Lb, the light portion greater than at least a half can be reached on the plane 15b and entered to the core 15 from the direction inclined to the same side as the inclination side of the plane 15b to the axis CA.

Moreover, in the angle formed between the axis CA and a portion of the light beam Lb farthest from the plane 15b, the size of an angle in the relationship of a corresponding angle to an acute angle formed between the plane 15b and the axis CA of the optical fiber 10 can be expressed by $\theta_{light}-\theta_{angle}$ as illustrated in FIG. 4. In the embodiment, as described above, since the entire light beam Lb is reached on the plane 15b from the same side as the inclination side of the plane 15b, $\theta_{light}-\theta_{angle}$ satisfies Expression (4) below as well as Expression (3) above.

$$\theta_{light}-\theta_{angle}>0 \quad (4)$$

In other words, Expression (4) is satisfied, so that the entire light beam Lb can be reached on the plane 15b and entered to the core 15 from the direction inclined to the same side as the inclination side of the plane 15b to the axis CA.

As described above, in the light beam Lb that is reached on the plane 15b and entered to the core 15 from the direction inclined to the same side as the inclination side of the plane 15b, which is an inclined plane, to the axis CA of the optical fiber 10, the propagation direction of the light beam Lb after entered comes closer to the axis CA of the optical fiber 10 as compared with a light beam that is reached on the plane perpendicular to the axis CA from the same direction and entered to the core 15. For example, as illustrated in FIG. 4, in the case where a light beam on a line CLb' parallel with the optical axis CLb is entered to the plane 15a perpendicular to the axis CA, in a light beam on the optical axis CLb entered to the plane 15b, the direction of the light beam after entered to the core 15 comes closer to the direction of the axis CA than the light beam on the line LCb' does. Therefore, in the case where the light beam Lb is entered to the core 15 from the plane perpendicular to the axis CA, the light beam Lb exceeds the numerical aperture of the core 15. Even though the light beam Lb is entered at an angle that the light beam Lb leaks to the cladding 16 after entered to the core 15, since the light beam Lb is entered to the plane 15b from the same side as the inclination side of the plane 15b to the axis CA, it is suppressed that the light beam Lb exceeds the numerical aperture of the core 15, and it is suppressed that the light beam Lb leaks to the cladding 16 after entered to the core 15.

Moreover, the light beam Lc is also reached on the plane 15c and entered to the core 15 from the direction inclined to the same side as the inclination side of the plane 15c to the axis CA of the optical fiber 10 as described above. Therefore, in the case where the light beam Lc is entered to the core 15 from the plane perpendicular to the axis CA, the light beam Lc exceeds the numerical aperture of the core 15. Even though the light beam Lc is entered at an angle that the light beam Lc leaks to the cladding 16 after entered to the core 15, since the light beam Lc is entered to the plane 15c from the same side as the inclination side of the plane 15c, it is suppressed that the light beam Lc exceeds the numerical aperture of the core 15, and it is suppressed that the light beam Lc leaks to the cladding 16 after entered.

In other words, even though the light beams Lb and Lc are entered to the core 15 from the direction inclined at a greater angle to the axis CA of the optical fiber 10, it is possible to suppress the leakage of the light beams after entered to the cladding 16.

Here, suppose that an angle formed between the axis CA of the optical fiber 10 and a certain light beam in the light beam Lb is defined as $\theta_{LD}$, $\theta_{LD}$ satisfies Expression (5) below.

$$\theta_{light} - \theta_{angle} \leq \theta_{LD} \leq \theta_{light} + \theta_{angle} \quad (5)$$

Moreover, suppose that as illustrated in FIG. 4, the size of an angle formed between a certain light beam in the light beam Lb and the perpendicular of the plane 15b is defined as $\theta_{air}$, the size of an angle formed between this perpendicular and the certain light beam after entered to the core 15 is defined as $\theta_{fiber}$, and the size of an angle formed between a line perpendicular to the axis CA and the certain light beam after entered to the core 15 is defined as $\theta_{input}$. Note that, FIG. 4 is the state in which the certain light beam in the light beam Lb is a light beam on the optical axis CLb.

In this case, $\theta_{air}$ satisfies Expression (6) below.

$$\theta_{air} = 90 - \theta_{taper} + \theta_{LD} \quad (6)$$

Note that, since the light beam Lb is entered to the plane 15b from the same side as the inclination side of the plane 15b to the axis CA, $\theta_{air}$ is an angle smaller than an angle of 90°.

Subsequently, $\theta_{fiber}$ satisfies Expression (7) below using the refractive index $n_{core}$ of the core 15 according to Snell's law.

$$\theta_{fiber} = \arcsin(\sin(\theta_{air})/n_{core}) \quad (7)$$

Meanwhile, $\theta_{input}$ can be described as Expression (8) below according to the conditions described above.

$$\theta_{input} = \theta_{fiber} + \theta_{taper} \quad (8)$$

Here, in order that the certain light beam is reflected off the core 15 and the cladding 16 and propagated through the core 15, Expression (9) below is satisfied where the refractive index of the cladding 16 is defined as $n_{clad}$.

$$n_{core}/n_{clad} \times \sin(\theta_{input}) \geq 1 \quad (9)$$

Expressions (5) to (8) above are applied to Expression (9), and conditions expressed by Expression (10) and Expression (11) below are obtained.

$$\frac{n_{core}}{n_{clad}} \times \sin\left(\sin^{-1}\left(\frac{\sin(\frac{\pi}{2} - \theta_{taper} + \theta_{light} + \theta_{angle})}{n_{core}}\right) + \theta_{taper}\right) \geq 1 \quad (10)$$

$$\frac{n_{core}}{n_{clad}} \times \sin\left(\sin^{-1}\left(\frac{\sin(\frac{\pi}{2} - \theta_{taper} + \theta_{light} - \theta_{angle})}{n_{core}}\right) + \theta_{taper}\right) \geq 1 \quad (11)$$

In other words, when the light beam Lb satisfies Expression (10) and Expression (11) above, it is possible to prevent the light beam after entered from leaking to the cladding 16 as long as such conditions are not provided that the optical fiber 10 is bent, for example.

Moreover, when the light beam Lb satisfies Expression (10) and Expression (11) and the optical axis of the light beam Lb is collimated to the axis CA after entered to the core 15, it is possible to further suppress the leakage of the light beam to the cladding 16 over the numerical aperture of the core 15 even in the region in which the optical fiber 10 is bent.

Furthermore, as described above, the light beam Lc is also propagated from the direction inclined to the same side as the inclination side where the plane 15c is inclined to the axis CA, and entered from the plane 15c to the core 15. Therefore, in the description with reference to FIG. 4, the plane 15b can be changed to the plane 15c, the light beam Lb can be changed to the light beam Lc, and the optical axis CLb can be changed to the optical axis CLc.

As described above, in the laser module 1 according to the embodiment, the light beams Lb and Lc are propagated from the direction inclined to the same side as the inclination sides of the planes 15b and 15c, which are inclined planes, to the axis CA of the optical fiber 10, and entered from the planes 15b and 15c to the core 15. In other words, the light beams Lb and Lc are entered from the regions Db and Dc through the planes 15b and 15c, respectively, to the core 15. Therefore, it is suppressed that the light beams Lb and Lc emitted from a plurality of the semiconductor laser elements leak to the cladding 16 after entered to the core 15, as compared with the case where light beams are entered to the core 15 from the plane perpendicular to the axis CA. Therefore, in accordance with the laser module 1 according to the embodiment, it is possible to efficiently emit light beams emitted from a plurality of the semiconductor laser elements.

Moreover, in the laser module 1 according to the embodiment, Expression (2) above is satisfied, so that the light beams Lb and Lc can be entered to the core 15 from the direction inclined at a greater angle to the axis CA of the optical fiber 10, as compared with the case where light beams are entered to the core from the incidence plane perpendicular to the axis of the optical fiber. Therefore, the light beams emitted from the laser elements 21 can be entered to the core 15 as a larger number of the laser elements 21 are arranged. Thus, the laser module 1 according to the embodiment can emit light of great intensity.

Furthermore, in the laser module 1 according to the embodiment, the light beam La is entered to the core 15 from the plane 15a perpendicular to the axis CA of the optical fiber 10. The light beam La can be entered similarly to the entrance of a light beam to a previously existing optical fiber. Therefore, in accordance with the laser module 1 according to the embodiment, in addition to the fact that the light beam emitted from the laser element 21 is entered to and propagated through the optical fiber 10 similarly to a previously existing laser module, the light beams Lb and Lc can be entered at a large angle and propagated as described above. Therefore, as compared with a previously existing optical module, it is possible that a larger number of light beams are entered and propagated through the optical fiber 10, and that light beams emitted from a larger number of laser elements are entered to and propagated through the optical fiber 10.

Note that, in the embodiment, the entire light beam Lb and the entire light beam Lc are propagated from the direction inclined to the same side as the inclination sides of the planes 15b and 15c to the axis CA of the optical fiber 10, and entered from the planes 15b and 15c to the core 15. However, it may be fine that the light beams Lb and Lc are propagated in the state in which the optical axes CLb and CLc are inclined to the same side as the inclination sides of the planes 15b and 15c to the axis CA and Expression (3) above is satisfied. In other words, it may be fine that in the light beams Lb and Lc, at least parts of the light beams Lb and Lc apart from the planes 15b and 15c beyond the optical axes CLb and CLc are not propagated from the direction inclined to the same side as the inclination sides of the planes 15b and 15c to the axis CA of the optical fiber 10. In this case, parts of light beams of the light beams Lb and Lc do not satisfy Expression (4) above. Even in this case, in the light beams Lb and Lc, the light portions on the optical axes CLb and CLc and the light portions on the planes 15b and 15c side of the optical axes CLb and CLc are propagated from the direction inclined to the same side as the inclination sides of the planes 15b and 15c to the axis CA of the optical fiber 10. In other words, in the light beams Lb and Lc, the light portions greater than at least a half are reached on the planes 15b and 15c from the direction inclined to the same side as the inclination sides of the planes 15b and 15c to the axis CA, and are entered to the core 15. As apparent from the description above, it is suppressed that the light portions leak to the cladding 16 even though the light portions are entered to the core 15 at a large angle, as compared with the case where light beams are entered to the core 15 from the plane perpendicular to the axis CA. As described above, the leakage of the light beams Lb and Lc to the cladding 16 is suppressed even though light portions greater than at least a half are entered to the core 15 at a larger angle, so that in the combination of the light beams Lb and Lc, it is possible that the light beams entered to the core 15 as a whole are entered to the optical fiber 10 at a larger angle and the light beams are propagated, as compared with a previously existing optical module. Therefore, it is possible that a larger number of laser elements are arranged and light beams emitted from the laser elements are entered to and propagated through the optical fiber 10.

Moreover, as described above, the planes 15b and 15c are inclined planes inclined in the directions in symmetry to each other relative to the axis CA. Therefore, the optical unit 20b that emits light beams to be entered from the plane 15b to the core 15 and the optical unit 20c that emits light beams to be entered from the plane 15c to the core 15 can be disposed in symmetry to the axis CA of the optical fiber 10. Thus, it is possible that spaces in which the optical units 20b and 20c are disposed are efficiently used and that a larger number of the laser elements 21 are disposed.

Furthermore, the planes 15a to 15c are in a long, narrow shape, and the light beams La to Lc are entered from the planes 15a to 15c, respectively, to the core 15 in the state in which the slow axial direction S is aligned with the longer direction of the planes 15a to 15c. Generally, the shape of a light beam emitted from the laser element on a cross section perpendicular to the optical axis is long in the slow axial direction and short in the fast axial direction. Therefore, the longer directions of the planes 15a to 15c are aligned with the slow axial directions S of the light beams as in the embodiment, so that the light beams La to Lc can be efficiently entered to the core 15.

Second Embodiment

Next, a second embodiment of the present invention will be described in detail with reference to FIGS. 5 and 6. Note that, components the same as or equivalent to the components of the first embodiment are designated the same reference numerals and signs, and the overlapping description will be omitted unless otherwise specified.

Figure 5:
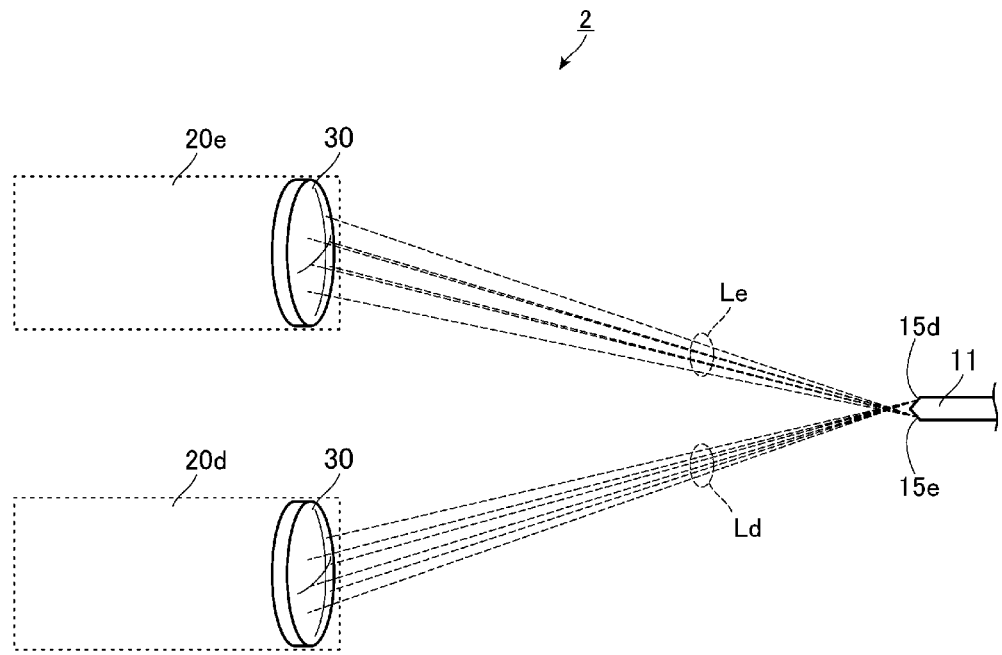
FIG. 5 is a conceptual diagram of a laser module according to a second embodiment of the present invention.

FIG. 5 is a conceptual diagram of a laser module according to this embodiment. As illustrated in FIG. 5, a laser module 2 according to the embodiment includes a plurality of optical units 20d and 20e and an optical fiber 11 to which light beams emitted from the optical units 20d and 20e are entered as a main configuration.

In the embodiment, the optical unit 20d and the optical unit 20e are disposed in parallel with each other.

The optical unit 20d and the optical unit 20e include a configuration similar to that of the optical unit 20a according to the first embodiment. However, the optical unit 20d is different from the optical unit 20a according to the first embodiment in that each of light beams Ld emitted from a condenser lens 30 is condensed on the condenser lens 30 side of the optical unit 20e rather than the center at the one end portion of the optical fiber 11. Moreover, the optical unit 20e is different from the optical unit 20a in that each of light beams Le emitted from a condenser lens 30 is condensed on the condenser lens 30 side of the optical unit 20d rather than the center at the one end portion of the optical fiber 11. The condenser lenses 30 of the optical unit 20d and the optical unit 20e are disposed in the state in which the positions are slightly displaced so as to condense the light beams as described above. Note that, in FIG. 5, the optical units 20d and 20e are depicted in a rectangle in a dotted line, and only the condenser lens 30 is depicted in the optical units 20d and 20e.

Figure 6:
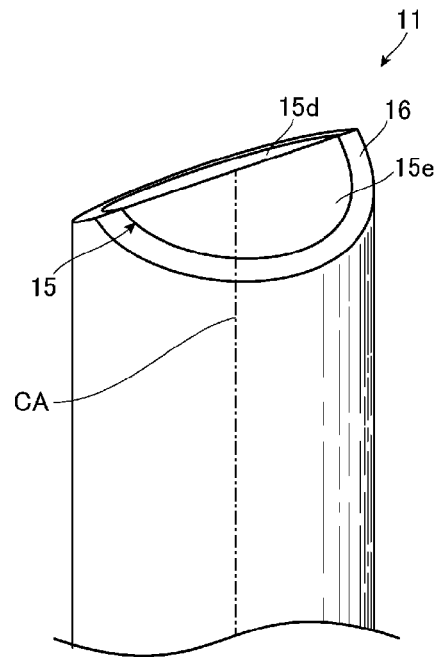
FIG. 6 is a diagram of the appearance of one end portion of an optical fiber in FIG. 5.

FIG. 6 is a diagram of the appearance of one end portion of the optical fiber 11 in FIG. 5. As illustrated in FIG. 6, the optical fiber 11 has a structure in a cross section the same as the structure of the optical fiber 10 according to the first embodiment, and includes a core 15 and a cladding 16. Moreover, the optical fiber 11 is different from the optical fiber 10 according to the first embodiment in the structure of the light incidence plane formed at one end portion to which a light beam is entered in that the incidence plane of the core 15 is formed of two planes 15d and 15e.

The two planes 15d and 15e are adjacent to each other as a line perpendicularly intersecting with the axis CA is a boundary, and are inclined planes inclined to the axis CA in the directions in symmetry to each other. Moreover, the planes 15d and 15e are in a congruent shape to each other in a long, narrow shape, in which the direction of the boundary between the planes 15d and 15e is a longer direction and the direction perpendicular to the longer direction is a shorter direction. Thus, in the two planes (inclined planes) 15d and 15e, the plane 15d is matched with a face that the other plane 15e is rotated relative to the axis CA.

As described above, as illustrated in FIG. 5, the optical fiber 11 having the light incidence plane formed of the planes 15d and 15e is disposed in such a manner that the plane 15e is located on the condenser lens 30 side of the optical unit 20d, the plane 15d is located on the condenser lens 30 side of the optical unit 20e, light beams from the optical unit 20d are condensed on the plane 15d, and light beams from the optical unit 20e are condensed on the plane 15e.

Then, the light beams Ld and Le emitted from the condenser lenses 30 of the optical units 20d and 20e are condensed on the planes 15d and 15e, respectively, and entered from the planes 15d and 15e to the core 15. At this time, each of the light beams Ld and Le is condensed and entered to the core 15 in the state in which the slow axial direction S is aligned with the longer directions of the planes 15d and 15e and the fast axial direction F is aligned with the shorter directions of the planes 15d and 15e. Moreover, as described above, the optical fiber 11 is disposed in such a manner that the plane 15d is faced to the condenser lens 30 side of the optical unit 20e and the plane 15e is faced to the condenser lens 30 side of the optical unit 20d, in which the entire light beams Ld and Le are reached on the planes 15d and 15e, respectively, from the direction inclined to the same side as the inclination sides of the planes 15d and 15e to the axis CA, and entered to the core 15. In other words, when seen on a cross section along the longer direction of the optical fiber 11, the light beam Ld is propagated from a region surrounded by a line and the plane 15d forming an acute angle, the line being passed through the incident point of the light beam entered to the plane 15d, which is an inclined plane, and parallel with the axis CA. When seen on a cross section along the longer direction of the optical fiber 11, the light beam Le is propagated from a region surrounded by a line and the plane 15e forming an acute angle, the line being passed through the incident point of the light beam entered to the plane 15e, which is an inclined plane, and parallel with the axis CA.

Each of the light beams entered to the core 15 is refracted based on the refractive index of the core 15, and propagated through the inside of the core 15.

Moreover, as described above, the light beams Ld and Le are propagated from the direction inclined to the same side as the inclination sides where the planes 15d and 15e are inclined to the axis CA, and entered from the planes 15d and 15e to the core 15. Therefore, in the description with reference to FIG. 4 in the first embodiment, the plane 15b can be changed to the planes 15d and 15e, the light beam Lb can be changed to the light beams Ld and Le, and the optical axis CLb can be changed to optical axes CLd and CLe in the case where the optical axes of the light beams Ld and Le are the optical axes CLd and CLe, respectively. Note that, in the embodiment, the optical axes CLd and CLe are not illustrated specifically.

In the laser module 2 according to the embodiment, although the incidence plane of the core 15 of the optical fiber 11 does not include a plane perpendicular to the axis CA, the light beams Ld and Le are propagated from the direction inclined to the same side as the inclination sides where the planes 15d and 15e, which are inclined planes, are inclined to the axis CA of the optical fiber 11, and entered from the planes 15d and 15e to the core 15. Therefore, in the first embodiment, because of an idea similar to the idea that the light beams Lb and Lc can be entered to the core 15 from the direction inclined at a greater angle to the axis CA of the optical fiber 10, the light beams Ld and Le can be entered to the core 15 from the direction inclined at a greater angle to the axis CA of the optical fiber 11. Thus, also in the laser module 2 according to the embodiment, the light beams emitted from the laser elements 21 can be entered to the core 15 as a larger number of the laser elements 21 are arranged, and light of great intensity can be emitted.

Moreover, in the description with reference to FIG. 4 in the first embodiment as described above, in the case where the plane 15b is changed to the planes 15d and 15e, the light beam Lb is changed to the light beams Ld and Le, and the optical axis CLb is changed to the optical axes CLd and CLe as the optical axes of the light beams Ld and Le are the optical axes CLd and CLe, it may be fine that the light beams Ld and Le are propagated in the state in which the optical axes CLd and CLe are inclined to the same side as the inclination sides of the planes 15d and 15e to the axis CA and Expression (3) is satisfied. In other words, also in the embodiment, similarly to the first embodiment, it may be fine that in the light beams Ld and Le, at least parts of the light beams Ld and Le apart from the planes 15d and 15e beyond the optical axes CLd and CLe are not propagated from the direction inclined to the same side as the inclination sides where the planes 15d and 15e are inclined to the axis CA of the optical fiber 11. Even in this case, from the reason similar to the first embodiment, in the light beams Ld and Le, the leakage of the light beams Ld and Le to the cladding 16 is suppressed even though light portions greater than at least a half are entered to the core 15 at a larger angle, so that in the combination of the light beams Ld and Le, it is possible that the light beams entered to the core 15 as a whole are entered to the optical fiber 11 at a larger angle and that the light beams are propagated. Furthermore, in this case, the numerical aperture of each of the light beams Ld and Le can be increased, so that it is possible to shorten the optical path lengths of the condensing portions of the light beams Ld and Le. The optical path lengths can be shortened, so that it is possible to suppress the influence of fluctuations of individual light beams on the accuracy of condensation and to contribute to the improvement of fiber output as a consequence.

In addition, in accordance with the laser module 2 according to the embodiment, the light incidence plane of the core 15 of the optical fiber 11 does not include a vertical surface perpendicular to the axis CA, so that it is possible to align light beams having the same optical path lengths and to contribute to the improvement of fiber output as a consequence.

Third Embodiment

Next, a third embodiment according to the present invention will be described in detail with reference to FIGS. 7 and 8. Note that, components the same as or equivalent to the components of the first embodiment are designated the same reference numerals and signs, and the overlapping description will be omitted unless otherwise specified.

Figure 7:
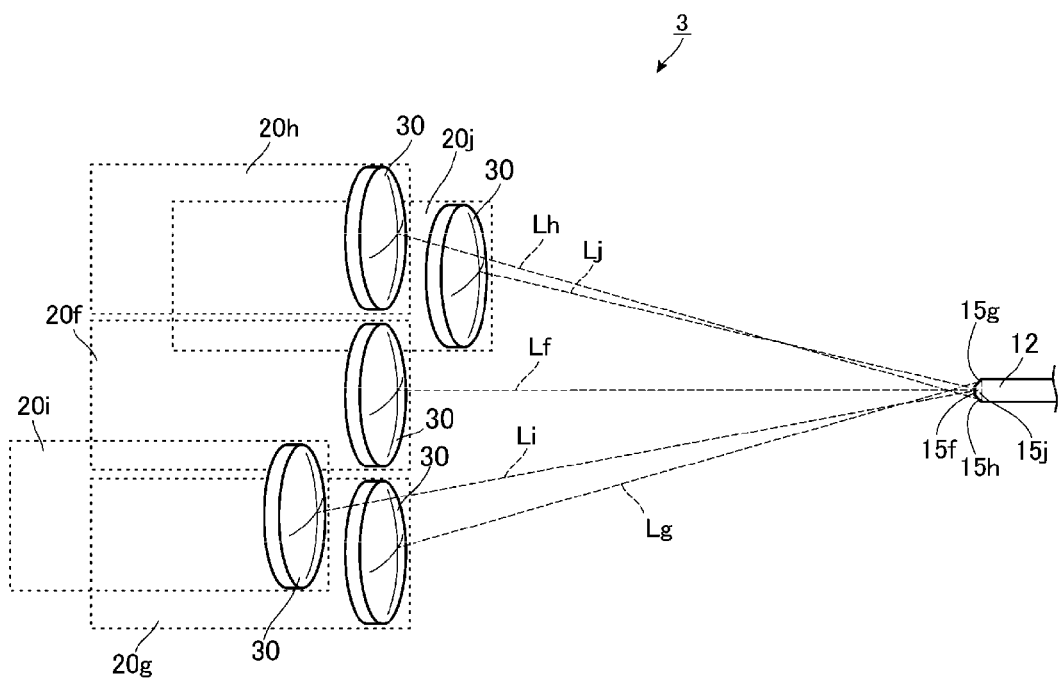
FIG. 7 is a conceptual diagram of a laser module according to a third embodiment of the present invention.

FIG. 7 is a conceptual diagram of a laser module according to this embodiment. As illustrated in FIG. 7, a laser module 3 according to the embodiment includes a plurality of optical units 20f to 20j and an optical fiber 12 to which light beams emitted from the optical units 20f to 20j are entered as a main configuration.

In the embodiment, the optical units 20f, 20g, and 20h are disposed in parallel with one another in such a manner that the optical unit 20f is sandwiched between the optical units 20g and 20h. Moreover, the optical units 20f, 20i, and 20j are disposed in parallel with one another in the direction crossing to the arranging direction of the optical units 20f, 20g, and 20h in such a manner that the optical unit 20f is sandwiched between the optical units 20i and 20j.

The optical units 20f to 20j include a configuration similar to that of the optical unit 20a according to the first embodiment. However, the optical unit 20g is different from the optical unit 20a according to the first embodiment in that each of light beams Lg emitted from a condenser lens 30 is condensed on the condenser lens 30 side of the optical unit 20h rather than the center at the one end portion of the optical fiber 12. The optical unit 20h is different from the optical unit 20a in that each of light beams Lh emitted from a condenser lens 30 is condensed on the condenser lens 30 side of the optical unit 20g rather than the center at the one end portion of the optical fiber 12. Moreover, the optical unit 20i is different from the optical unit 20a according to the first embodiment in that each of light beams Li emitted from a condenser lens 30 is condensed on the condenser lens 30 side of the optical unit 20j rather than the center at the one end portion of the optical fiber 11. The optical unit 20j is different from the optical unit 20a in that each of light beams Lj emitted from the condenser lens 30 is condensed on the condenser lens 30 side of the optical unit 20i rather than the center at the one end portion of the optical fiber 12. The condenser lenses 30 of the optical units 20g to 20j are disposed in the state in which the positions are slightly displaced so as to condense the light beams as described above. Note that, also in FIG. 7, similarly in FIG. 5, the optical units 20f to 20j are depicted in a rectangle in a dotted line, and only the condenser lens 30 is depicted in the optical units 20f to 20j. Moreover, in order to avoid complicated illustrations, light beams emitted from the optical units 20f to 20j are depicted only by a light beam on the optical axis.

Figure 8:
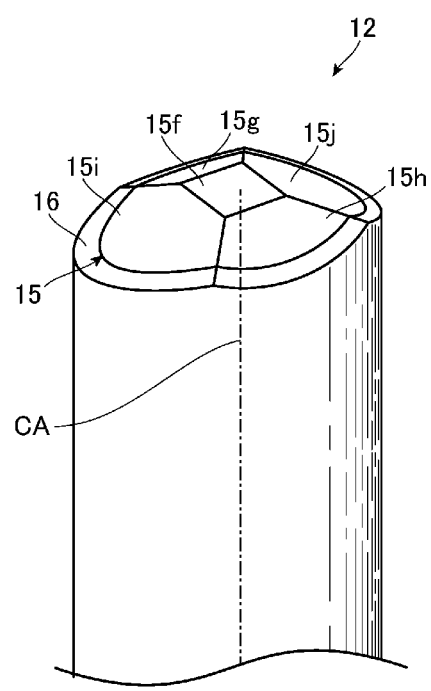
FIG. 8 is a diagram of the appearance of one end portion of an optical fiber in FIG. 7.

FIG. 8 is a diagram of the appearance of one end portion of the optical fiber 12 for use in the laser module 3 according to the embodiment. As illustrated in FIG. 8, the optical fiber 12 has a structure on a cross section similar to the optical fiber 10 according to the first embodiment, and includes a core 15 and a cladding 16. Moreover, the optical fiber 12 is different from the optical fiber 10 according to the first embodiment in the structure of the light incidence plane formed at one end portion to which a light beam is entered in that the incidence plane of the core 15 is formed of five planes 15f to 15j. The plane 15f in the center is a vertical surface perpendicular to the axis CA of the optical fiber 12. The plane 15f is in a nearly square shape, and is matched with a shape that both end portions of the plane 15a in the longer direction are cut in the first embodiment. Furthermore, two planes 15g and 15h are adjacent to the plane 15f in a congruent shape to each other, and the shapes are matched with a shape that both end portions of the planes 15b and 15c in the longer direction are cut in the first embodiment. In addition, the planes 15i and 15j are in a congruent shape to each other and in a shape that the planes 15g and 15h are rotated at an angle of 90° about the axis CA. In other words, in the four planes 15g, 15h, 15i, and 15j, a single inclined plane (for example, 15g) is matched with a face that another inclined plane (15h, 15i, or 15j) is rotated relative to the axis CA.

As described above, as illustrated in FIG. 7, the optical fiber 12 having the light incidence plane formed of the planes 15f to 15j is disposed in such a manner that the plane 15f is faced to the condenser lens 30 of the optical unit 20f, the plane 15h is located on the condenser lens 30 side of the optical unit 20g, the plane 15g is located on the condenser lens 30 side of the optical unit 20h, the plane 15j is located on the condenser lens 30 side of the optical unit 20i, and the plane 15i is located on the condenser lens 30 side of the optical unit 20j. Moreover, the optical fiber 12 is disposed in such a manner that light beams from the optical unit 20g are condensed on the plane 15g, light beams from the optical unit 20h are condensed on the plane 15h, light beams from the optical unit 20i are condensed on the plane 15i, and light beams from the optical unit 20j are condensed on the plane 15j.

Then, similarly in the first embodiment in which a light beam emitted from the condenser lens 30 of the optical unit 20a is entered from the plane 15a to the core 15, a light beam emitted from the condenser lens 30 of the optical unit 20f is entered from the plane 15f to the core 15. Moreover, the light beams Lg to Lj emitted from the condenser lenses 30 of the optical units 20g to 20j are condensed on the planes 15g to 15j, respectively, and entered from the planes 15g to 15j to the core 15. As described above, the optical fiber 12 is disposed in such a manner that the plane 15g is faced to the condenser lens 30 side of the optical unit 20h, the plane 15h is faced to the condenser lens 30 side of the optical unit 20g, the plane 15i is faced to the condenser lens 30 side of the optical unit 20j, and the plane 15j is faced to the condenser lens 30 side of the optical unit 20i, in which the light beams Lg to Lj are reached on the planes 15g to 15j, respectively, from the direction inclined to the same side as the inclination sides of the planes 15g to 15j to the axis CA, and are entered to the core 15. In other words, when seen on a cross section along the longer direction of the optical fiber 11, the light beams Lg to Lj are propagated from a region surrounded by a line and the planes 15g to 15j forming an acute angle, the line being passed through the incident point of a light beam entered to the planes 15g to 15j, which are inclined planes, and parallel with the axis CA, and entered to the core 15.

Each of the light beams entered to the core 15 is refracted based on the refractive index of the core 15, and propagated through the inside of the core 15.

Furthermore, in this manner, the light beams Lg to Lj are propagated from the direction inclined to the same side as the inclination sides where the planes 15g to 15j are inclined to the axis CA as described above, and entered from the plane 15h to 15j, respectively, to the core 15. Therefore, in the description with reference to FIG. 4 in the first embodiment, the plane 15b can be changed to the planes 15g to 15j, the light beam Lb can be changed to the light beams Lg to Lj, and the optical axis CLb can be changed to optical axis CLg to CLj in the case where the optical axes of the light beams Lg to Lj are the optical axes CLg to CLj. Note that, in the embodiment, the optical axis CLg to CLj are not illustrated more specifically.

In accordance with the laser module 3 according to the embodiment, it is possible to enter light beams from a larger number of the inclined planes to the optical fiber 12, as compared with the laser module 1 according to the first embodiment. Therefore, it is possible to emit light of greater intensity.

Moreover, in the description with reference to FIG. 4 in the first embodiment as described above, in the case where the plane 15b is changed to the planes 15g to 15j, the light beam Lb is changed to the light beams Lg to Lj, and the optical axis CLb is changed to the optical axis CLg to CLj as the optical axes of the light beams Lg to Lj are the optical axes CLg to CLj, it may be fine that the light beams Lg to Lj are propagated in the state in which the optical axis CLg to CLj are inclined to the same side as the inclination sides of the planes 15g to 15j to the axis CA and Expression (3) satisfied. In other words, also in the embodiment, similarly to the first embodiment, it may be fine that in the light beams Lg to Lj, at least parts of the light beams Lg to Lj apart from the planes 15g to 15j beyond the optical axis CLg to CLj are not propagated from the direction inclined to the same side as the inclination sides where the planes 15g to 15j are inclined to the axis CA of the optical fiber 12. Even in this case, from the reason similar to the first embodiment, in the light beams Lg to Lj, even though light portions greater than at least a half are entered to the core 15 at a larger angle, the leakage of the light beams Lg to Lj to the cladding 16 is suppressed, so that in the combination of the light beams Lg to Lj, it is possible that the light beams entered to the core 15 as a whole are entered to the optical fiber 12 at a larger angle and that the light beams are propagated.

As described above, the present invention is described as the first to third embodiments are taken as an example. However, the present invention is not limited to the embodiments.

For example, in the optical fibers 10 to 12 according to the first to third embodiments, the incidence plane of the core 15 includes a plurality of the inclined planes. In the present invention, it may be fine that the incidence plane of the core 15 is formed of a single inclined plane and a single vertical surface. For this example, this case can be taken where the laser module 1 according to the first embodiment does not include the optical unit 20c and the light incidence plane of the core 15 of the optical fiber 10 includes only the plane 15a, which is a vertical surface, and the plane 15b, which is an inclined plane. In this case, for example, in the case where the incidence plane of the core 15 is seen along the axis of the optical fiber CA, it may be fine that the plane 15a is formed to the region in which the plane 15c is formed. Then, similarly to the first embodiment, light beams can be entered to the plane 15a similarly to light beams entered to a previously existing optical fiber. Moreover, light beams can be entered to the plane 15b at a large angle because of the reason similar to the reason that light beams can be entered to the plane 15b of the optical fiber 10 according to the first embodiment at a large angle. Therefore, in addition to the fact that a light beam emitted from the laser element can be entered to the vertical surface and propagated through the optical fiber similarly to a previously existing laser module, light beams can be entered to the inclined plane at a large angle and propagated, so that light beams emitted from a larger number of laser elements can be entered to and propagated through the optical fiber as compared with a previously existing optical module.

Furthermore, in the foregoing embodiments, each of the light beams La to Lj is a light beam that laser light beams emitted from a plurality of the laser elements 21 are condensed on the incidence plane of the core 15 of the optical fiber. It may be fine that each of the light beams La to Lj is formed of a light beam emitted from a single laser element 21.

In addition, in the foregoing embodiments, the optical units 20a to 20j individually include the condenser lens 30. However, such a configuration may be fine that in the laser modules 1 to 3, the optical units share a single condenser lens.

Moreover, in the foregoing embodiments, the optical units are disposed in parallel with one another.
However, it may be fine that at least a part of the optical units is not disposed in parallel with one another as long as light beams emitted from the optical units are entered to the optical fiber similarly in the embodiments.

INDUSTRIAL APPLICABILITY

As described above, according to the present invention, there is provided a laser module that can emit light of great intensity and can be used for a pumping light source and the like of a fiber laser device, an optical fiber amplifier, and the like.

REFERENCE SIGNS LIST 1 to 3 . . . laser module
10 to 12 . . . optical fiber
15 . . . core
15a to 15j . . . plane
16 . . . cladding
20a to 20j . . . optical unit
21 . . . laser element
22,23 . . . cylindrical lens
30 . . . condenser lens
CA . . . axis

The invention claimed is:

1. A laser module comprising:
a plurality of laser elements; and
an optical fiber including a core to which light beams emitted from the plurality of the laser elements are entered, wherein
a light incidence plane of the core has a convex shape and includes a plurality of planes unparalleled with each other to which a light beam emitted from at least one laser element is entered, and
when seen on a cross section along a longer direction of the optical fiber, a light beam entered to the core from an inclined plane inclined to an axis of the optical fiber in the plurality of the planes is propagated to the inclined plane from a region surrounded by a line and the inclined plane forming an acute angle, the line being passed through an incident point of the light beam entered to the inclined plane and parallel with the axis, wherein, in the region, the line and the inclined plane form the acute angle,
wherein when seen on a cross section along the longer direction of the optical fiber, an expression is satisfied:

$$\theta_{light} + \theta_{angle} < \theta_{taper}$$

where a size of an acute angle formed between the inclined plane and the axis is defined as $\theta_{taper}$, a size of an angle that is a corresponding angle of the acute angle and formed between the optical axis and the axis is defined as $\theta_{light}$, and an angle of divergence of a light beam entered from the inclined plane to the core with respect to the optical axis is defined as $\theta_{angle}$.

2. The laser module according to claim 1, wherein when seen on a cross section along the longer direction of the optical fiber, an expression is satisfied:

$$\theta_{NA} < \theta_{taper}$$

where a maximum angle of incidence of a light beam that does not leak from the core when the light beam is entered to the core from a plane perpendicular to the axis is defined as $\theta_{NA}$.

3. The laser module according to claim 1, wherein all of expressions are satisfied:

$$\frac{n_{core}}{n_{clad}} \times \sin\left(\sin^{-1}\left(\frac{\sin(\frac{\pi}{2} - \theta_{taper} + \theta_{light} + \theta_{angle})}{n_{core}}\right) + \theta_{taper}\right) \geq 1$$

$$\frac{n_{core}}{n_{clad}} \times \sin\left(\sin^{-1}\left(\frac{\sin(\frac{\pi}{2} - \theta_{taper} + \theta_{light} - \theta_{angle})}{n_{core}}\right) + \theta_{taper}\right) \geq 1$$

where a refractive index of the core of the optical fiber is defined as $n_{core}$, and a refractive index of a cladding of the optical fiber is defined as $n_{clad}$.

4. The laser module according to claim 3, wherein optical axes of light beams entered from the individual planes to the core are caused to be collimated to the axis.

5. The laser module according to claim 1, wherein in light beams entered from the individual planes to the core, light beams emitted from at least the two laser elements are condensed on the individual planes through a condenser lens.

6. The laser module according to claim 5, wherein
the light beams before condensed through the condenser lens are collimated light beams, and
the collimated light beams are collimated to each other.

7. The laser module according to claim 1, wherein in the plurality of the planes, one plane is a vertical surface perpendicular to the axis.

8. The laser module according to claim 1, wherein in the plurality of the planes, at least two planes are the inclined planes, and one inclined plane is matched with a face that the other inclined plane is rotated relative to the axis.

9. The laser module according to claim 1, wherein
the plurality of planes each is a plane in a shape including a longer direction and a shorter direction, and
a light beam emitted from the laser element is entered from the plane in the shape including the longer direction and the shorter direction to the core as a slow axial direction is aligned with the longer direction of the plane in the shape including the longer direction and the shorter direction.

\* \* \* \* \*